(12) United States Patent  
Anderson et al.

(10) Patent No.: US 8,383,443 B2  
(45) Date of Patent: Feb. 26, 2013

(54) NON-UNIFORM GATE DIELECTRIC CHARGE FOR PIXEL SENSOR CELLS AND METHODS OF MANUFACTURING

(75) Inventors: Brent A. Anderson, Jericho, VT (US); Andres Bryant, Burlington, VT (US); William F. Clark, Jr., Essex Junction, VT (US); John J. Ellis-Monaghan, Grand Isle, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 386 days.

(21) Appl. No.: 12/780,193

(22) Filed: May 14, 2010

(65) Prior Publication Data

US 2011/0278649 A1    Nov. 17, 2011

(51) Int. Cl.  
*H01L 21/00* (2006.01)

(52) U.S. Cl. ............... 438/57; 257/292; 257/E31.08; 257/E31.081; 257/233; 257/293; 438/60; 438/75; 438/144; 438/24

(58) Field of Classification Search .............. 438/60, 438/75, 144, 24, 57; 257/E31.08, E31.081, 257/233, 293, 292  
See application file for complete search history.

(56) References Cited

U.S. PATENT DOCUMENTS

| | | | |
|---|---|---|---|
| 3,823,394 A | 7/1974 | Byrum, Jr. et al. |
| 3,942,161 A | 3/1976 | Byrum, Jr. et al. |
| 3,982,113 A | 9/1976 | Coldren |
| 4,063,131 A | 12/1977 | Miller |
| 4,087,805 A | 5/1978 | Miller |
| 4,087,807 A | 5/1978 | Miavecz |
| 4,130,779 A | 12/1978 | Miller et al. |
| 4,246,591 A | 1/1981 | Kosonocky et al. |
| 4,331,889 A | 5/1982 | Parrish |
| 4,541,068 A | 9/1985 | Tower |
| 4,684,812 A | 8/1987 | Tew et al. |
| 4,707,608 A | 11/1987 | DiBianca |
| 4,746,972 A | 5/1988 | Takanashi et al. |
| 4,779,004 A | 10/1988 | Tew et al. |
| 4,801,919 A | 1/1989 | Hansen et al. |
| 4,897,728 A | 1/1990 | Yamada |
| 4,939,560 A | 7/1990 | Narabu et al. |
| 4,984,044 A | 1/1991 | Yamamura |
| 5,008,758 A | 4/1991 | Burke |
| 5,198,673 A | 3/1993 | Rougeot et al. |
| 5,381,014 A | 1/1995 | Jeromin et al. |
| 5,459,509 A | 10/1995 | Monoi |
| 5,459,510 A | 10/1995 | Hamalainen |
| 5,523,603 A * | 6/1996 | Fishbein et al. ............. 257/356 |
| 5,532,128 A | 7/1996 | Eggers et al. |
| 5,576,562 A | 11/1996 | Konuma |
| 5,591,996 A | 1/1997 | Haigh et al. |
| 5,653,939 A | 8/1997 | Hollis et al. |
| 5,670,322 A | 9/1997 | Eggers et al. |
| 5,736,732 A | 4/1998 | Possin et al. |
| 5,760,431 A | 6/1998 | Savoye et al. |
| 5,771,271 A | 6/1998 | Iodice |

(Continued)

*Primary Examiner* — N Drew Richards  
*Assistant Examiner* — Yu-Hsi D Sun  
(74) *Attorney, Agent, or Firm* — Anthony Canale; Roberts Mlotkowski Safran & Cole, P.C.

(57) ABSTRACT

A non-uniform gate dielectric charge for pixel sensor cells, e.g., CMOS optical imagers, and methods of manufacturing are provided. The method includes forming a gate dielectric on a substrate. The substrate includes a source/drain region and a photo cell collector region. The method further includes forming a non-uniform fixed charge distribution in the gate dielectric. The method further includes forming a gate structure on the gate dielectric.

16 Claims, 5 Drawing Sheets

U.S. PATENT DOCUMENTS

| | | | |
|---|---|---|---|
| 5,846,708 | A | 12/1998 | Hollis et al. |
| 5,901,257 | A | 5/1999 | Chen et al. |
| 6,177,333 | B1 | 1/2001 | Rhodes |
| 6,305,853 | B1 | 10/2001 | Bishay et al. |
| 6,326,227 | B1 | 12/2001 | Thomas et al. |
| 6,330,145 | B1 | 12/2001 | Lepert et al. |
| 6,346,739 | B1 | 2/2002 | Lepert et al. |
| 6,440,814 | B1 | 8/2002 | Lepert et al. |
| 6,492,694 | B2 | 12/2002 | Noble et al. |
| 6,501,142 | B2 | 12/2002 | Thomas et al. |
| 6,546,326 | B1 | 4/2003 | Gerdes |
| 6,549,235 | B1 | 4/2003 | Fossum et al. |
| 6,555,842 | B1 | 4/2003 | Fossum et al. |
| 6,555,888 | B2 | 4/2003 | Lepert et al. |
| 6,570,617 | B2 | 5/2003 | Fossum et al. |
| 6,665,009 | B1 | 12/2003 | Dong |
| 6,737,329 | B2 | 5/2004 | Lepert et al. |
| 6,744,068 | B2 | 6/2004 | Fossum et al. |
| 6,795,342 | B1 | 9/2004 | He et al. |
| 6,803,275 | B1 | 10/2004 | Park et al. |
| 6,825,523 | B2 | 11/2004 | Caprara et al. |
| 6,856,001 | B2 | 2/2005 | Rhodes |
| 6,888,919 | B2 | 5/2005 | Graf |
| 6,912,163 | B2 | 6/2005 | Zheng et al. |
| 6,914,627 | B1 | 7/2005 | Dong |
| 6,969,886 | B1 | 11/2005 | Park et al. |
| 7,071,531 | B2 | 7/2006 | Rhodes |
| 7,105,371 | B2 | 9/2006 | Fossum et al. |
| 7,115,472 | B2 | 10/2006 | Caprara et al. |
| 7,118,967 | B1 | 10/2006 | Ngo et al. |
| 7,132,724 | B1 | 11/2006 | Merrill |
| 7,148,525 | B2 | 12/2006 | Mouli |
| 7,163,860 | B1 | 1/2007 | Kamal et al. |
| 7,208,810 | B2 | 4/2007 | Wright |
| 7,227,925 | B1 | 6/2007 | Mansfield et al. |
| 7,232,724 | B1 | 6/2007 | Shiraiwa et al. |
| 2005/0151218 | A1 | 7/2005 | Mouli |
| 2005/0202584 | A1 | 9/2005 | Mouli |
| 2005/0274994 | A1 | 12/2005 | Rhodes |
| 2007/0018211 | A1 | 1/2007 | Rhodes |
| 2007/0096176 | A1 | 5/2007 | Mouli |
| 2011/0121313 | A1* | 5/2011 | Briere .............................. 257/76 |

* cited by examiner

NON-UNIFORM GATE DIELECTRIC CHARGE FOR PIXEL SENSOR CELLS AND METHODS OF MANUFACTURING

FIELD OF THE INVENTION

The invention relates to pixel sensor cells and methods of manufacturing and, more particularly, to non-uniform gate dielectric charge for pixel sensor cells, e.g., CMOS optical imagers, and methods of manufacturing.

BACKGROUND

Pixel sensor cells (e.g., CMOS imagers) can suffer from added noise and reduced dynamic range due to reintroduction of stored FET-channel charge into the photo-collection region following an erase. For example, after erasing a photocell of charge, the pass gate is switched off, prior to exposure to a new image. In switching the pass gate off, some channel charge leaks back into the photo collector, contaminating the erased state and raising the noise floor (black level).

To address this issue, pixel sensor cells have been manufactured using doped polysilicon gate-electrodes with work function which changes laterally across the transfer gate. However, with doped polysilicon gates this is not scalable due to the length-scale of dopant interdiffusion in the polysilicon. Also, graded gate work-function has been used to provide a lateral channel field to help empty this pass-gate charge away from the photo collector to minimize this effect. However, this adds material complexities to the fabrication process.

Accordingly, there exists a need in the art to overcome the deficiencies and limitations described hereinabove.

SUMMARY

In an aspect of the invention, a method comprises forming a gate dielectric on a substrate. The substrate includes a source/drain region and a photo cell collector region. The method further includes forming a non-uniform fixed charge distribution in the gate dielectric. The method further includes forming a gate structure on the gate dielectric.

In an aspect of the invention, a method of forming a pixel sensor cell comprises forming a gate dielectric on a substrate. The substrate includes a source/drain region and a photo cell collector region. The method further includes forming a resist on the gate dielectric and opening a hole in the resist to expose a portion of the gate dielectric. The method further includes implanting a charge into the gate dielectric to form a non-uniform fixed charge distribution in the gate dielectric, and stripping the resist. The method further includes forming a gate structure on the gate dielectric.

In an aspect of the invention, a pixel sensor cell comprises a collection area and a transfer FET. The transfer FET comprises a gate dielectric, where a portion of the gate dielectric has a fixed charge which is positioned so as to assist in evacuation of charge in a channel of the FET away from the collection area.

In another aspect of the invention, a design structure tangibly embodied in a machine readable storage medium for designing, manufacturing, or testing an integrated circuit is provided. The design structure comprises the structures of the present invention.

In further embodiments, a hardware description language (HDL) design structure encoded on a machine-readable data storage medium comprises elements that when processed in a computer-aided design system generates a machine-executable representation of the pixel sensor cells (PCS), which comprises the structures of the present invention. In still further embodiments, a method in a computer-aided design system is provided for generating a functional design model of the PCS. The method comprises generating a functional representation of the structural elements of the PCS.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to pixel sensor cells and methods of manufacturing and, more particularly, to non-uniform gate dielectric charge for pixel sensor cells, e.g., CMOS optical imagers, and methods of manufacturing. In embodiments, the pixel sensor cells include a fixed charge at one end of the gate dielectric. Depending on the location of the fixed charge and type of device, e.g., NFET or PFET, the fixed charge can either repel or repulse the stored channel charge away from the photo-collector of the pixel sensor cells when the transfer FET is shut off following an erase operation. Advantageously, the fixed charge will draw the charge from the photo-collector to enhance device performance. Also, advantageously, the present invention is scalable and avoids materials complexities.

In embodiments, the pixel sensor cells (e.g., optical imager) comprise a collection area (e.g., photo-collector) and a transfer FET. The transfer FET comprises a gate dielectric, where a portion of the gate dielectric has a fixed charge which is positioned so as to assist in the evacuation of charge in the channel away from the collection area. In embodiments, the dielectric can comprise a silicon oxynitride or high-k dielectric and the fixed charge comprises an alkali ion. In alternative embodiments, the fixed charge comprises a metallic ion. In still other alternative embodiments, the fixed charge can be any species with a low value of electronegativity (i.e., electrons are easily removed from the atomic species to leave a positive ion in a gate dielectric).

Figure 1:
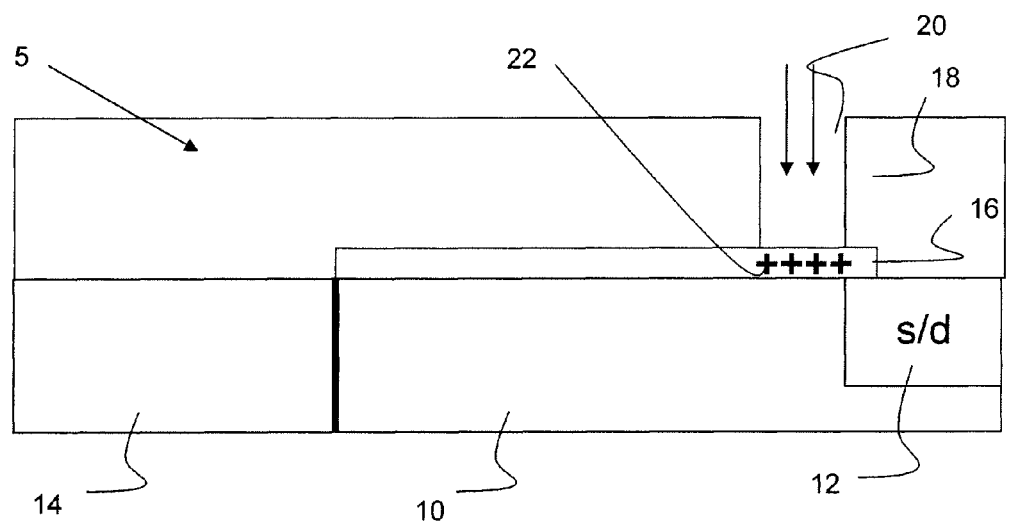
FIG. 1 shows a structure and method of manufacturing an NFET pixel sensor cell in accordance with aspects of the invention.

FIG. 1 shows a structure and method of manufacturing an NFET pixel sensor cell in accordance with the invention. In particular, the structure 5 includes a substrate 10. The substrate 10 can be, for example, silicon. The substrate 10 includes a conventionally formed source/drain region 12 and a photo collector region 14. A gate dielectric 16 is formed on the substrate 10 using conventional deposition and patterning processes. For example, the gate dielectric 16 can be deposited on the substrate 10 using conventional deposition processes such as chemical vapor deposition. In embodiments, the gate dielectric 16 can be $SiO_2$, oxide, oxynitride or other insulator materials. The gate dielectric 16 can also be a high-k stack such as, for example, $HfO_2$, Hf Silicate, etc, with the bottom layer being, for example, $SiO_2$. The gate dielectric 16 can have a thickness of about 5 nm to about 50 nm. The thick dielectric will reduce leakage.

Still referring to FIG. 1, a resist 18 is deposited (formed) on the gate dielectric 16. In embodiments, the resist 18 can be deposited to a thickness of about 500 nm to 2000 nm.

The resist 18 is patterned to form an opening 20 at one side of the structure. The opening will expose a portion of the gate dielectric 16, on one side of the structure, e.g., in the case of an NFET, near the source/drain region 12 (and remote from the photo collector region 14). In the case of an NFET, the structure undergoes an ion implantation with species that form positively charged ions (e.g., with low electronegativity) at the source/drain side 12 of the structure to form a positive charge region 22. The ion implantation can be, for example, any alkaline or metal material such as, for example, potassium, cesium, rubidium or other group I metals. In this manner, a laterally non-uniform fixed charge distribution (e.g., positive charge region 22) in the gate dielectric 16 can be formed to provide a built-in field. In this embodiment, the built-in field (i.e., positive charge region 22) pushes the device charge away from the photo collector region 14 when the transfer FET is off.

Figure 2:
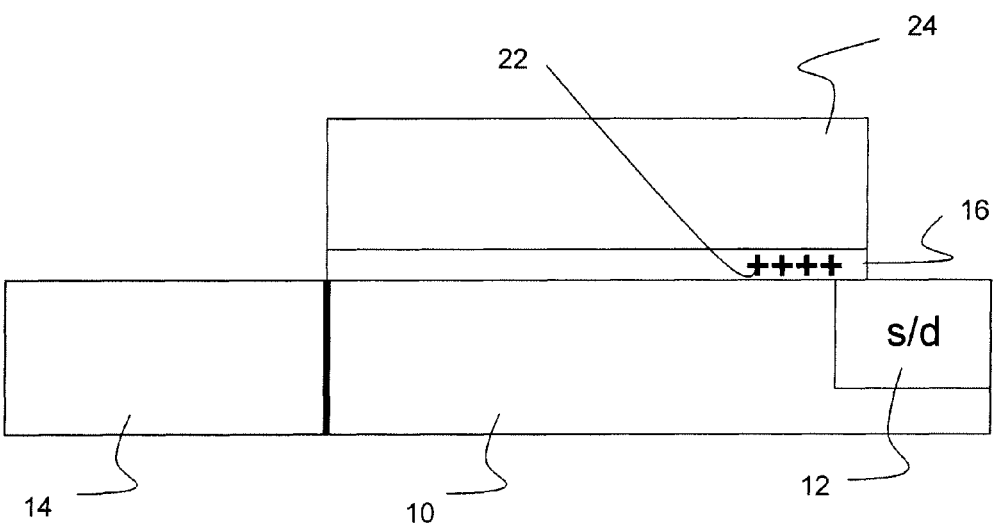
FIG. 2 shows an NFET pixel sensor cell and respective manufacturing steps in accordance with aspects of the invention.

FIG. 2 shows an NFET pixel sensor cell and respective manufacturing steps in accordance with aspects of the invention. In FIG. 2, the resist is stripped using conventional processes, known to those of skill in the art. After the resist is stripped, in optional embodiments, the gate dielectric 16 can be polished and/or cleaned. A conventional gate structure 24 is then formed on the gate dielectric 16. For example, the gate structure 24 can be a poly gate with respective structures.

Figure 3:
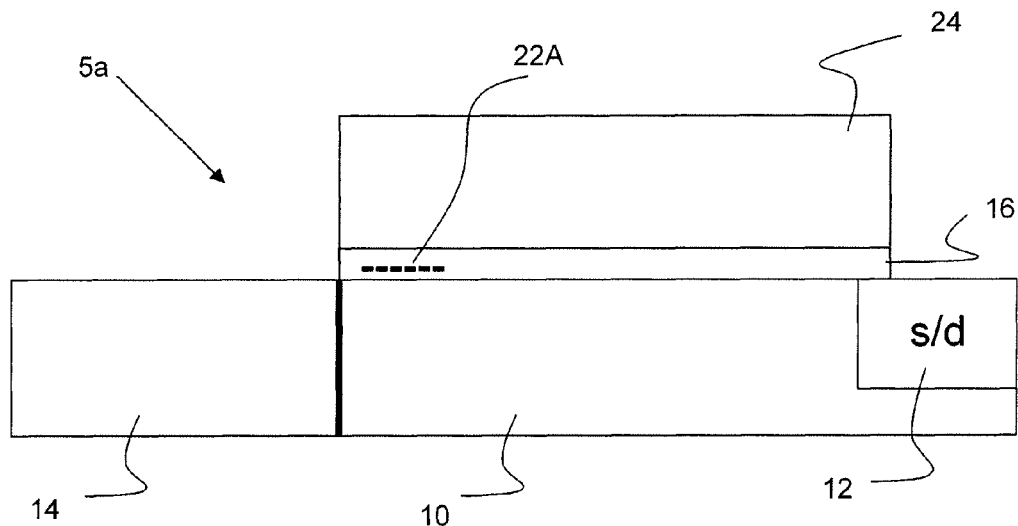
FIG. 3 shows an alternative NFET pixel sensor cell and respective manufacturing steps in accordance with aspects of the invention.

FIG. 3 shows an alternative NFET pixel sensor cell and respective manufacturing steps in accordance with aspects of the invention. In particular, the NFET pixel sensor cell 5a includes a negative charge region 22A adjacent to the photo collector region 14 (remote from the source/drain region 12). In the fabrication of this structure 5a, the resist 18 is deposited (formed) on the gate dielectric 16, and patterned to form an opening near the photo collector region 14 (remote from the source/drain region 12). In the case of an NFET, the structure 5a undergoes an ion implantation of a species to form a negative charge region 22A near the photo collector region 14 (remote from the source/drain region 12). The ion implantation can be, for example, any species which ionizes in the dielectric by capture of an additional electron (typically an atom with high value of electronegativity, such as silver). In this manner, a laterally non-uniform fixed charge distribution (e.g., negative charge region 22A) in the gate dielectric 16 can be formed to provide a built-in field. In this embodiment, the built-in field (negative charge region 22A) pushes the device charge into the source/drain region 12 when the FET is off.

Figure 4:
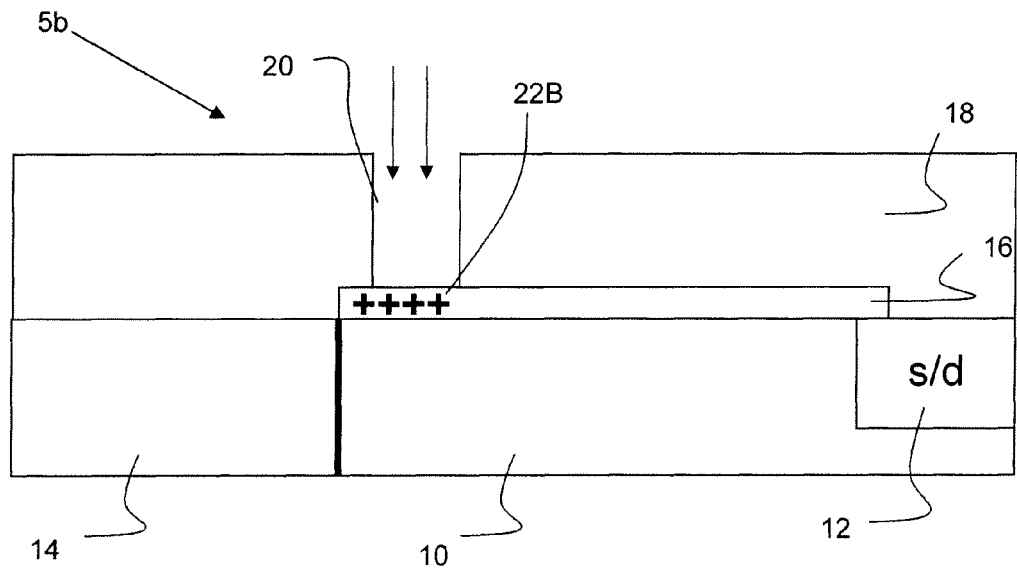
FIG. 4 shows a structure and method of manufacturing a PFET pixel sensor cell in accordance with aspects of the invention.

FIG. 4 shows a structure and method of manufacturing a PFET pixel sensor cell in accordance with the invention. In particular, the structure 5b includes a substrate 10 which, in embodiments, can be, for example, silicon. The substrate 10 includes a conventionally formed source/drain region 12 and a photo collector region 14. A gate dielectric 16 is formed on the substrate 10 using conventional processes. For example, the gate dielectric 16 can be deposited on the substrate 10 using conventional deposition processes such as chemical vapor deposition. In embodiments, the gate dielectric 16 can be $SiO_2$, oxide, oxynitride, or other insulator materials or stacks as discussed above. The gate dielectric 16 can have a thickness of about 5 nm to about 50 nm. The thick dielectric will reduce leakage.

Still referring to FIG. 4, a resist 18 is deposited (formed) on the gate dielectric 16. In embodiments, the resist 18 can be deposited to a thickness of about 500 nm to 2000 nm.

The resist 18 is patterned to form an opening 20 at one side of the structure 5, i.e., near the photo collector region 14 (remote from the source/drain region 12). The opening 20 will expose a portion of the gate dielectric 16, on one side of the structure, adjacent to the photo collector region 14. In the case of a PFET, the structure 5b undergoes a positive ion implantation near the photo collector region 14 to form a positive charge region 22B. The ion implantation can be, for example, any alkaline or metal material such as, for example, potassium, cesium, rubidium or other group I metals. In this manner, a laterally non-uniform fixed charge distribution (e.g., positive charge region 22B) in the gate dielectric 16 can be formed to provide a built-in field. In this embodiment, the built-in field (i.e., positive charge region 22B) pushes the device charge away from the photo collector region 14 when the transfer FET is off.

Figure 5:
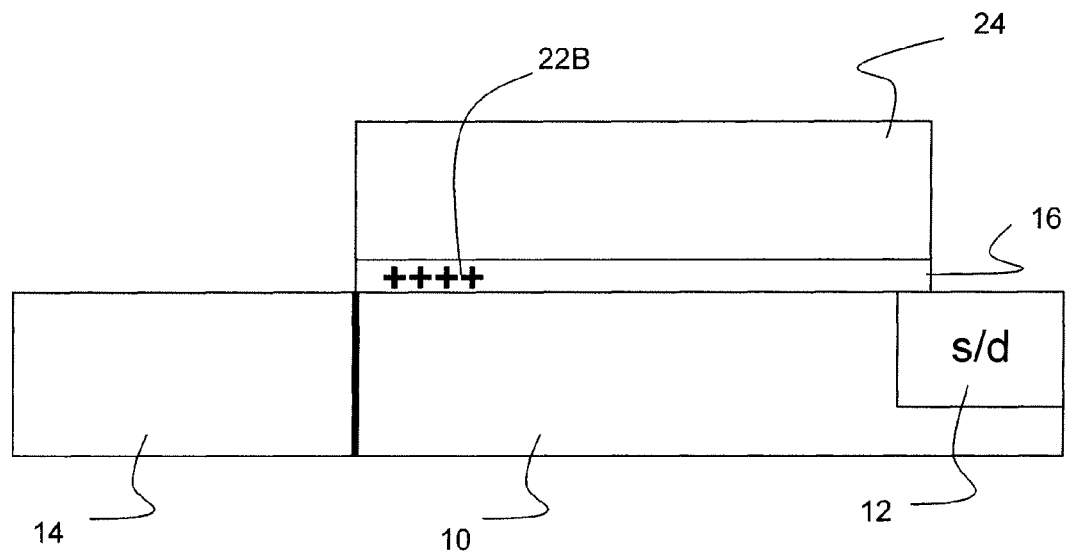
FIG. 5 shows a PFET pixel sensor cell and respective manufacturing steps in accordance with aspects of the invention.

FIG. 5 shows a PFET pixel sensor cell and respective manufacturing steps in accordance with aspects of the invention. In FIG. 5, the resist is stripped using conventional processes, known to those of skill in the art. After the resist is stripped, in optional embodiments, the gate dielectric 16 can be polished and/or cleaned. A conventional gate structure 24 is then formed on the gate dielectric 16. For example, the gate structure 24 can be a poly gate with respective structures.

Figure 6:
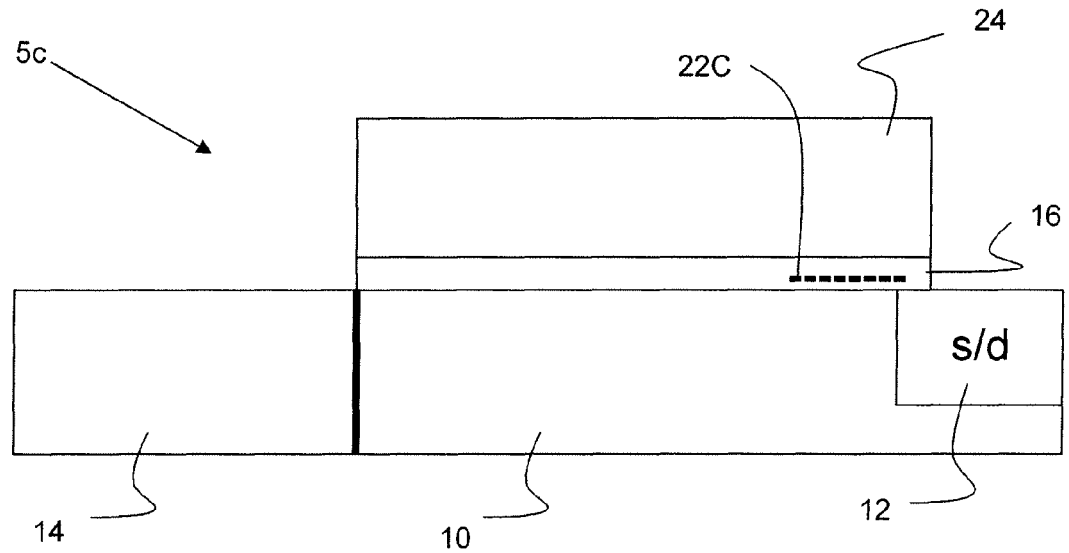
FIG. 6 shows an alternative PFET pixel sensor cell and respective manufacturing steps in accordance with aspects of the invention.

FIG. 6 shows an alternative PFET pixel sensor cell and respective manufacturing steps in accordance with aspects of the invention. In particular, the PFET pixel sensor cell 5c includes a negative charge region 22C adjacent to the source/drain region 12 (remote from the photo collector region 14). In the fabrication of this structure 5c, the resist 18 is deposited (formed) on the gate dielectric 16, and patterned to form an opening near the source/drain region 12 (remote from the photo collector region 14). In the case of a PFET, the structure undergoes an negative ion implantation of a species with high value of electronegtivity to form a negative charge region 22C. The ion implantation can be, for example, any negative species which largely ionizes in the gate dielectric to form negative ions. In this manner, a laterally non-uniform fixed charge distribution (i.e., negative charge region 22C) in the gate dielectric 16 can be formed to provide a built-in field. In this embodiment, the built-in field (i.e., negative charge region 22B) pulls the device charge into the source/drain region 12 when the FET is off.

Figure 7:
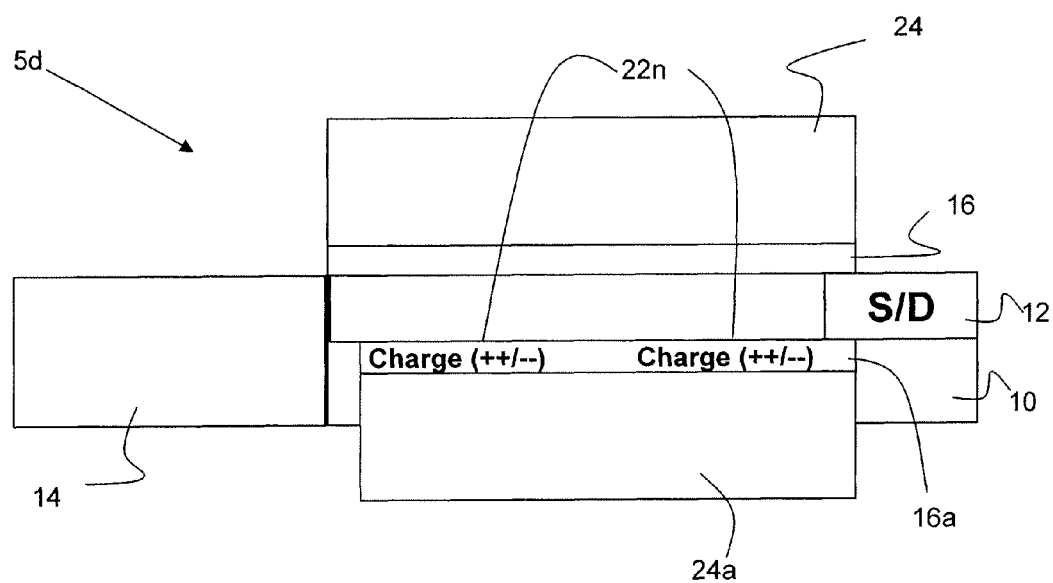
FIG. 7 shows a double gate FET pixel sensor cell and respective manufacturing steps in accordance with aspects of the invention.

FIG. 7 shows a double gate FET pixel sensor cell and respective manufacturing steps in accordance with aspects of the invention. In embodiments, the double gate FET pixel sensor cell can be either an NFET or PFET depending on the location and type of implant used to create the fixed charge 22n. In particular, the FET pixel sensor cell 5d includes a charge region 22n either near the source/drain region 12 or the photo collector region 14, in a bottom dielectric layer 16a. In this embodiment, a lower gate structure 24 will be completely isolated from the substrate 10 by the gate dielectric 16a. As discussed above, for a NFET, a positive charge will be near the source/drain region 12 or a negative charge would be near the photo collector region 14. In the case of a PFET, a positive charge will be near the photo collector region 14 or a negative charge would be near the source/drain region 12. The charges can be implanted in the manner described with reference to any of the other embodiments.

Figure 8:
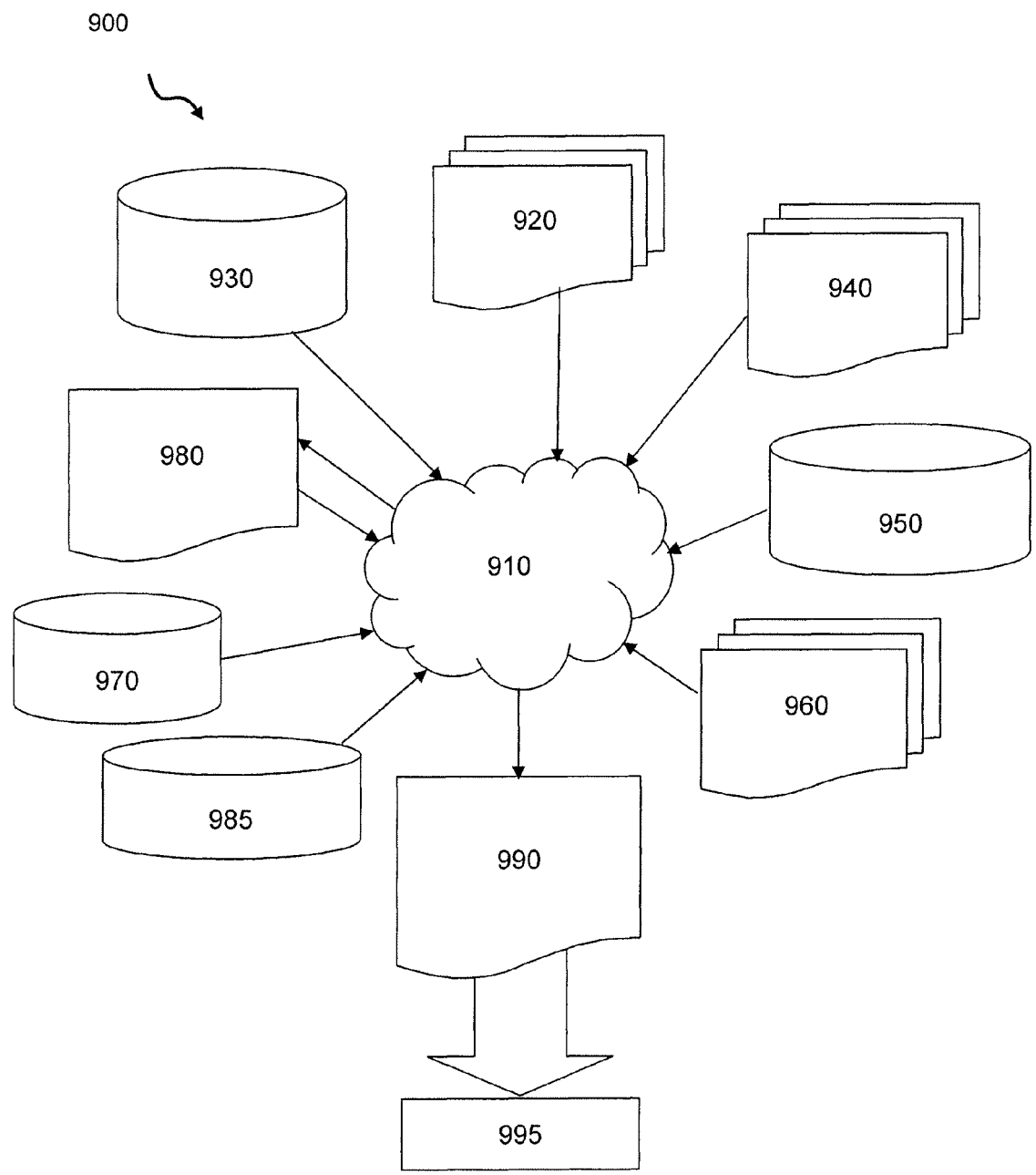
FIG. 8 is a flow diagram of a design process used in semiconductor design, manufacture, and/or test.

FIG. 8 is a flow diagram of a design process used in semiconductor design, manufacture, and/or test. FIG. 8 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-7. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 8 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information.

Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g. information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7. In one embodiment, design structure 990 may comprise a compiled, executable HDL simulation model that functionally simulates the devices shown in FIGS. 1-7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-7. Design structure 990 may then proceed to a stage 995 where, for example, design structure 990: proceeds to tape-out, is released to manufacturing, is released to a mask house, is sent to another design house, is sent back to the customer, etc.

The method as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

The corresponding structures, materials, acts, and equivalents of all means or step plus function elements in the claims, if applicable, are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principals of the invention and the practical application, and to enable others of ordinary skill in the art to understand the invention for various embodiments with various modifications as are suited to the particular use contemplated. Accordingly, while the invention has been described in terms of embodiments, those of skill in the art will recognize that the invention can be practiced with modifications and in the spirit and scope of the appended claims.

What is claimed:

1. A method, comprising:
   forming a gate dielectric on a substrate, the substrate including a source/drain region and a photo cell collector region; and
   forming a non-uniform fixed charge distribution in the gate dielectric; and
   forming a gate structure on the gate dielectric,
   wherein forming the non-uniform fixed charge distribution includes ion implanting the gate dielectric through an opening formed in a resist deposited on the gate dielectric; and
   the resist covers at least a portion of the gate dielectric while exposing another portion of the gate dielectric through the opening.

2. The method of claim 1, wherein the ion implanting includes exposing the gate dielectric to a positive charge on a side near the source/drain region.

3. The method of claim 1, wherein the ion implanting includes exposing the gate dielectric to a negative charge on a side near the photo cell collector region.

4. The method of claim 1, wherein the ion implanting includes exposing the gate dielectric to a positive charge on a side near the photo cell collector region.

5. The method of claim 1, wherein the ion implanting includes exposing the gate dielectric to a negative charge on a side near the source/drain region.

6. The method of claim 1, wherein forming the gate structure on the gate dielectric includes forming a double gate structure.

7. The method of claim 1, wherein forming the non-uniform fixed charge distribution in the gate dielectric includes ion implanting a group 1 metal.

8. The method of claim 1, wherein forming the non-uniform fixed charge distribution in the gate dielectric includes ion implanting a negative species.

9. A method of forming a pixel sensor cell, comprising:
   forming a gate dielectric on a substrate, the substrate including a source/drain region and a photo cell collector region;
   forming a resist on the gate dielectric;
   opening a hole in the resist to expose a portion of the gate dielectric; and
   implanting a charge into the gate dielectric through the hole to form a non-uniform fixed charge distribution in the gate dielectric;
   stripping the resist; and
   forming a gate structure on the gate dielectric,
   wherein the resist covers at least a portion of the gate dielectric while exposing another portion of the gate dielectric through the hole.

10. The method of claim 9, wherein the hole is opened on a side of the gate dielectric near the source/drain region.

11. The method of claim 10, wherein the charge is a positive charge for an NFET pixel sensor cell and a negative charge for a PFET pixel sensor cell.

12. The method of claim 9, wherein the hole is opened on a side of the gate dielectric near the photo cell collector region.

13. The method of claim 12, wherein the charge is a positive charge for a PFET pixel sensor cell and a negative charge for an NFET pixel sensor cell.

14. The method of claim 13, wherein the positive charge is formed by a group 1 metal.

15. The method of claim 13 wherein a negative charge is formed by a negative species.

16. The method of claim 9, wherein the gate structure is formed a double gate structure.

* * * * *